(12) United States Patent
Kikuchi et al.

(10) Patent No.: US 11,784,070 B2
(45) Date of Patent: Oct. 10, 2023

(54) HEAT TREATMENT APPARATUS, HEAT TREATMENT METHOD, AND FILM FORMING METHOD

(71) Applicant: Tokyo Electron Limited, Tokyo (JP)

(72) Inventors: Yasuaki Kikuchi, Iwate (JP); Tatsuya Yamaguchi, Iwate (JP); Kazuteru Obara, Iwate (JP); Ryuji Kusajima, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 19 days.

(21) Appl. No.: 16/852,475

(22) Filed: Apr. 18, 2020

(65) Prior Publication Data

US 2020/0340116 A1    Oct. 29, 2020

(30) Foreign Application Priority Data

Apr. 26, 2019 (JP) ................................ 2019-086436

(51) Int. Cl.
*H01L 21/67* (2006.01)
*C23C 16/46* (2006.01)
(Continued)

(52) U.S. Cl.
CPC ...... *H01L 21/67248* (2013.01); *C23C 16/345* (2013.01); *C23C 16/46* (2013.01); *C23C 16/52* (2013.01); *H01L 21/0217* (2013.01); *H01L 21/0228* (2013.01); *H01L 21/02269* (2013.01); *H01L 21/67109* (2013.01); *H01L 21/67303* (2013.01)

(58) Field of Classification Search
CPC ........... H01L 21/67248; H01L 21/0217; H01L 21/02269; H01L 21/0228; H01L 21/67109; H01L 21/67303; H01L 21/67103; H01L 21/67017; H01L 21/02164; H01L 21/02175; C23C 16/345; C23C 16/46; C23C 16/52; C23C 16/45527; C23C 16/45544; C23C 16/45578; C23C 16/45525
See application file for complete search history.

(56) References Cited

U.S. PATENT DOCUMENTS 11,396,700 B2* 7/2022 Hisakado .......... C23C 16/45578
11,462,401 B2* 10/2022 Takagi ................. C23C 16/403
(Continued)

FOREIGN PATENT DOCUMENTS

JP  2006-186049 A  7/2006
JP  2008-016742 A  1/2008
(Continued)

*Primary Examiner* — Jeffrie R Lund
(74) *Attorney, Agent, or Firm* — Venjuris, P.C.

(57) ABSTRACT

A heat treatment apparatus includes: an inner tube having a cylindrical shape and configured to accommodate a substrate; an outer tube configured to cover an outside of the inner tube; a heater provided around the outer tube; a gas supply pipe that extends along a longitudinal direction in the inner tube; an opening formed in a side wall of the inner tube facing the gas supply pipe; a temperature sensor provided at a position shifted by a predetermined angle from the opening in a circumferential direction of the inner tube; and a controller that controls the heater based on a detected value of the temperature sensor.

15 Claims, 4 Drawing Sheets

(51) Int. Cl.
  *C23C 16/34*  (2006.01)
  *C23C 16/52*  (2006.01)
  *H01L 21/02*  (2006.01)
  *H01L 21/673*  (2006.01)

(56) References Cited

U.S. PATENT DOCUMENTS

| | | | |
|---|---|---|---|
| 11,594,412 B2* | 2/2023 | Nishida | H01L 21/0228 |
| 2008/0008566 A1* | 1/2008 | Endo | F27B 17/0025 |
| | | | 414/217.1 |
| 2014/0357058 A1* | 12/2014 | Takagi | C23C 16/402 |
| | | | 438/478 |
| 2015/0370245 A1* | 12/2015 | Sugishita | H01L 21/67248 |
| | | | 700/121 |
| 2018/0130664 A1* | 5/2018 | Nakatani | H01L 21/28562 |
| 2018/0286662 A1* | 10/2018 | Nagatomi | C23C 16/45563 |
| 2019/0333789 A1* | 10/2019 | Inoue | H01L 21/6719 |
| 2020/0024731 A1* | 1/2020 | Horita | H01L 21/0214 |
| 2020/0312655 A1* | 10/2020 | Nishida | C23C 16/45563 |
| 2020/0340111 A1* | 10/2020 | Kikuchi | C23C 16/345 |
| 2020/0340116 A1* | 10/2020 | Kikuchi | C23C 16/52 |
| 2020/0343114 A1* | 10/2020 | Yamaguchi | H01L 21/67253 |
| 2021/0202242 A1* | 7/2021 | Horita | H01L 21/67023 |
| 2021/0242023 A1* | 8/2021 | Ogawa | H01L 21/28088 |
| 2022/0298642 A1* | 9/2022 | Sato | C23C 16/45508 |
| 2022/0307137 A1* | 9/2022 | Kasamatsu | C23C 16/45561 |
| 2022/0411933 A1* | 12/2022 | Takamura | C23C 16/45544 |

FOREIGN PATENT DOCUMENTS

| | | | | |
|---|---|---|---|---|
| JP | 2014-067877 A | | 4/2014 | |
| JP | 2014-236129 A | | 12/2014 | |
| JP | 2015-010247 A | | 1/2015 | |
| JP | 2018-166142 A | | 10/2018 | |
| JP | 7113862 B2 | * | 8/2022 | ....... C23C 16/45514 |
| JP | 7122907 B2 | * | 8/2022 | ............ H01L 21/02 |
| JP | 7236922 B2 | * | 3/2023 | ............ C23C 16/345 |
| KR | 10-1623740 B1 | | 5/2016 | |
| KR | 20200125464 A | * | 4/2020 | |

* cited by examiner

HEAT TREATMENT APPARATUS, HEAT TREATMENT METHOD, AND FILM FORMING METHOD

CROSS-REFERENCE TO RELATED APPLICATIONS

This application is based on and claims priority from Japanese Patent Application No. 2019-086436 filed on Apr. 26, 2019 with the Japan Patent Office, the disclosure of which is incorporated herein in its entirety by reference.

TECHNICAL FIELD

The present disclosure relates to a heat treatment apparatus, a heat treatment method, and a film forming method.

BACKGROUND

A batch-type substrate processing apparatus capable of performing, for example, a film forming processing on a plurality of substrates in a state where the plurality of substrates are held in multiple tiers in a substrate holder within a processing chamber, is known. As for the substrate processing apparatus, a technology that detects the inner temperature of a processing chamber by laying a protection tube at a position having a phase difference of 90 degrees from a cooling gas supply pipe laid vertically on one side of the processing chamber, and sealing a thermal contact of a thermocouple at the protection tube, is known (see., e.g., Japanese Patent Laid-Open Publication No. 2006-186049).

SUMMARY

A heat treatment apparatus according to an aspect of the present disclosure includes: an inner tube having a cylindrical shape and configured to accommodate a substrate; an outer tube configured to cover an outside of the inner tube; a heater provided around the outer tube; a gas supply pipe extending along a longitudinal direction in an inner wall of the inner tube; an opening formed in a side wall of the inner tube that face the gas supply pipe; a temperature sensor provided at a position shifted by a predetermined angle from the opening in a circumferential direction of the inner tube; and a controller configured to control the heater based on a detected value of the temperature sensor.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

(Heat Treatment Apparatus)

Figure 1:
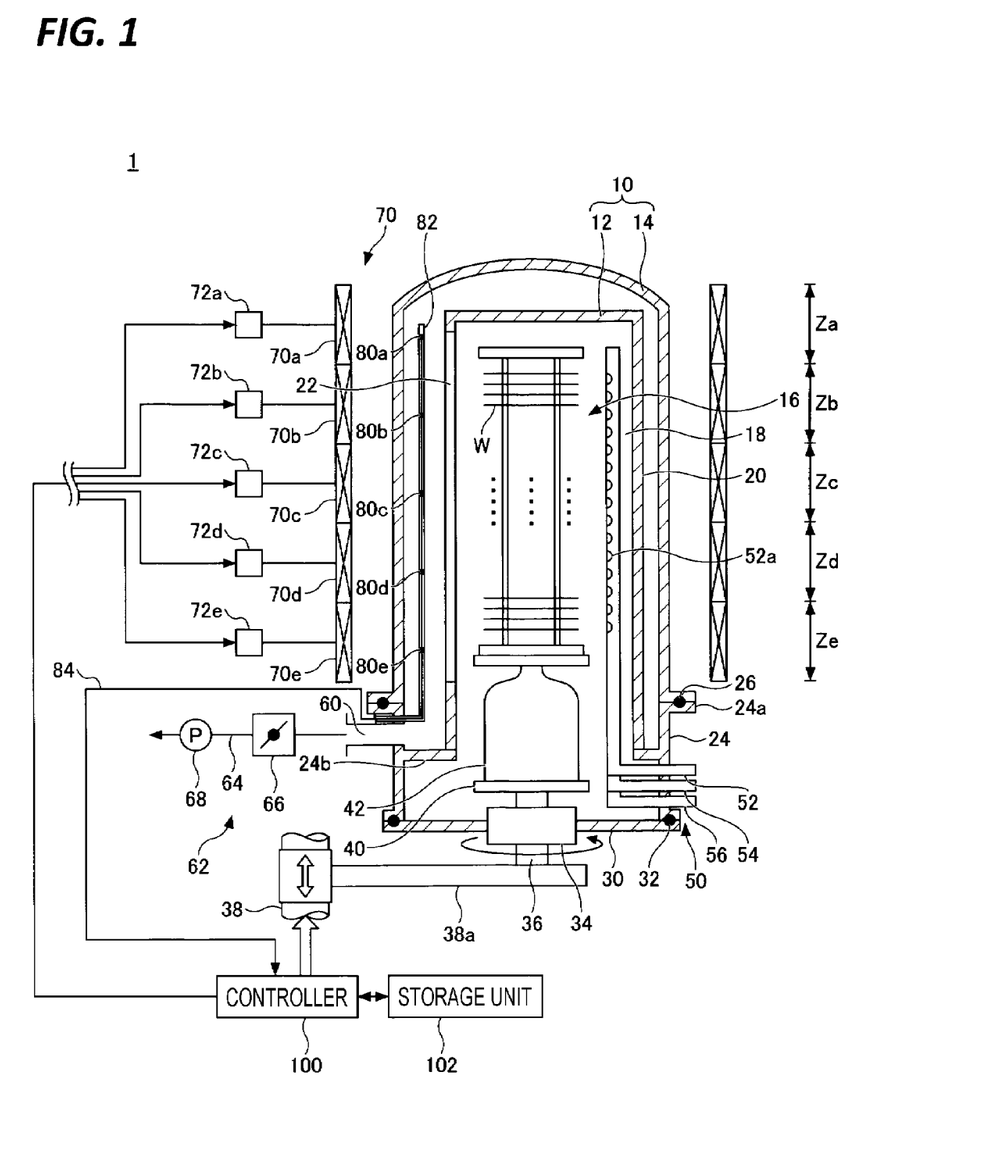
FIG. 1 is a cross-sectional view illustrating an exemplary configuration of a heat treatment apparatus.
Figure 2:
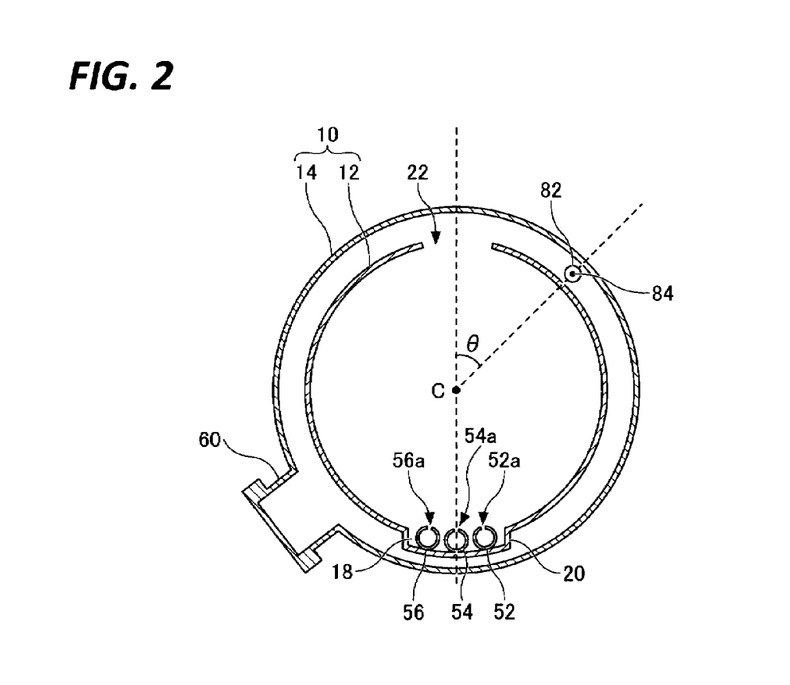
FIG. 2 is a view for explaining a positional relationship between an opening formed in an inner tube and temperature sensors.

Descriptions will be made on a heat treatment apparatus according to an embodiment. FIG. 1 is a cross-sectional view illustrating an exemplary configuration of the heat treatment apparatus according to the embodiment. FIG. 2 is a view for explaining a positional relationship between an opening formed in an inner tube and temperature sensors.

As illustrated in FIG. 1, a heat treatment apparatus 1 includes a processing container 10. The processing container 10 includes a cylindrical inner tube 12 having a ceiling and an open lower end and a cylindrical outer tube 14 having a ceiling and an open lower end and configured to cover the outside of the inner tube 12. The inner tube 12 and the outer tube 14 are formed of an insulating material such as quartz, and coaxially arranged to form a double tube structure. A wafer boat 16 is accommodated in the inner tube 12. The wafer boat 16 is a substrate holder that substantially horizontally holds a plurality of semiconductor wafers (hereinafter, referred to as "wafers W") at predetermined intervals along the vertical direction. The wafer W is an example of the substrate.

The ceiling of the inner tube 12 is, for example, flat. A nozzle accommodation portion 18 is formed at one side of the inner tube 12 and accommodates a gas supply pipe along the longitudinal direction (vertical direction) of the inner tube 12. For example, as illustrated in FIG. 2, the nozzle accommodation portion 18 is a portion of the inside of a block portion 20 formed by protruding a portion of a side wall of the inner tube 12 toward the outside. A rectangular opening 22 is formed on a side wall of an opposite side of the inner tube 12 facing the nozzle accommodation portion 18 along the longitudinal direction (vertical direction) of the inner tube 12.

The opening 22 is a gas exhaust port formed so as to exhaust the gas in the inner tube 12. The opening 22 has the same length as a length of the wafer boat 16, or extends in both the upper and lower directions to be longer than the length of the wafer boat 16.

A lower end of the processing container 10 is supported by a cylindrical manifold 24 made of, for example, stainless steel. A flange portion 24a is formed on an upper end of the manifold 24, and a lower end of the outer tube 14 is installed to be supported on the flange portion 24a. A seal member 26 (e.g., an O-ring) is interposed between the flange portion 24a and the lower end of the outer tube 14 so that the inside of the outer tube 14 is air-tightly sealed.

An annular support 24b is provided at an inner wall of the upper portion of the manifold 24, and a lower end of the inner tube 12 is installed to be supported on the support 24b. A cover 30 is air-tightly attached to an opening at the lower end of the manifold 24 through a seal member 32 (e.g., an O-ring) so as to air-tightly close the opening at the lower end of the processing container 10, that is, the opening of the manifold 24. The cover 30 is made of, for example, stainless steel.

A rotation shaft 36 is provided at the center portion of the cover 30 to penetrate through a magnetic fluid sealing portion 34. A lower portion of the rotation shaft 36 is rotatably supported by an arm 38a of a lifting unit 38 including a boat elevator.

A rotation plate 40 is provided at the upper end of the rotation shaft 36, and the wafer boat 16 that holds the wafers W is placed on the rotation plate 40 via a heat retention pedestal 42 made of quartz. Therefore, the cover 30 and the wafer boat 16 are integrally moved up and down by moving the lifting unit 38 up and down, so that the wafer boat 16 can be inserted into or removed from the processing container 10.

A gas supply 50 is provided at the manifold 24, and introduces a gas into the inner tube 12. The gas supply 50 includes a plurality (three in the illustrated example) of gas supply pipes 52, 54, and 56 made of quartz. Each of the gas supply pipes 52, 54, and 56 extends in the inner tube 12 along the longitudinal direction thereof, and its base end is bent in an L-shape and supported so as to penetrate the manifold 24.

As illustrated in FIG. 2, the gas supply pipes 52, 54, and 56 are provided to be aligned in a line along the circumferential direction in the nozzle accommodating portion 18 of the inner tube 12. Each of the gas supply pipes 52, 54, and 56 has a plurality of gas holes 52a, 54a, and 56a at predetermined intervals along the longitudinal direction. Each of the gas holes 52a, 54a, and 56a ejects each gas in the horizontal direction. The predetermined intervals are set to be, for example, the same as the intervals of the wafers W supported by the wafer boat 16. Further, a position in a height direction is set such that each of the gas holes 52a, 54a, and 56a is positioned in the middle of the wafers W adjacent in the vertical direction, and each gas can be efficiently supplied to the space between the wafers W. As the type of gas, a film forming gas, an etching gas, and a purge gas are used, and each gas can be supplied through each of the gas supply pipes 52, 54, and 56 as necessary while controlling the flow rate of each gas.

A gas outlet 60 is formed above the support 24b that is a side wall of the upper portion of the manifold 24, and is configured to be able to exhaust the gas in the inner tube 12 discharged from the opening 22 through a space between the inner tube 12 and the outer tube 14. The gas outlet 60 is provided at a position different from the opening 22 in the circumferential direction of the inner tube 12. In the illustrated example, the gas outlet 60 is provided at a position shifted by 120 degree counterclockwise from the position of the opening 22 in the circumferential direction of the inner tube 12. The gas outlet 60 is provided with an exhaust unit 62. The exhaust unit 62 includes an exhaust passage 64 connected to the gas outlet 60, and a pressure adjusting valve 66 and a vacuum pump 68 are sequentially interposed in the exhaust passage 64 so as to evacuate the inside of the processing container 10.

A cylindrical heater 70 is provided to cover the outer tube 14 around the outer tube 14. The heater 70 heats the wafers W accommodated in the processing container 10.

The space in the processing container 10 is divided into a plurality of unit regions, for example, five unit regions Za, Zb, Zc, Zd, and Ze along the vertical direction. The unit region Za is also referred to as "TOP" because it is the uppermost unit region in the vertical direction. Further, the unit region Ze is also referred to as "BTM" because it is the lowest unit region in the vertical direction. The unit regions Zb, Zc, and Zd are also referred to as "CTR1", "CTR2," and "CTR3," respectively, because they are intermediate regions in the vertical direction.

Further, the heater 70 is also divided into heaters 70a, 70b, 70c, 70d, and 70e so as to correspond one-to-one with the unit regions along the vertical direction. The outputs of the heaters 70a to 70e are independently controlled by power controllers 72a to 72e corresponding to each of the unit regions Za to Ze, respectively.

Further, in the space in the processing container 10, temperature sensors 80a to 80e configured to detect the temperature are provided corresponding to each of the unit regions Za to Ze. The temperature sensors 80a to 80e detect the temperature to detect the temperature distribution along the vertical direction. The temperature sensors 80a to 80e are accommodated in a protection tube 82 made of, for example, quartz, and are provided between the inner tube 12 and the outer tube 14. As illustrated in FIG. 2, the temperature sensors 80a to 80e and the protection tube 82 configured to accommodate the temperature sensors 80a to 80e are provided at a position shifted by a predetermined angle θ from the position of the opening 22 in the circumferential direction of the inner tube 12. Therefore, since the temperature sensors 80a to 80e are positioned at a blind spot from the gas supply pipes 52, 54, and 56, it is possible to suppress the detected temperature of the temperature sensors 80a to 80e from being lowered by the gases ejected from the gas supply pipes 52, 54, and 56. For example, a thermocouple, or a resistance temperature detector may be used as the temperature sensors 80a to 80e.

Detection signals from the temperature sensors 80a to 80e are input to a controller 100 (to be described later) via a signal line 84. The controller 100 to which the detection signals are input calculates set values of the power controllers 72a to 72e, and outputs the calculated set values to each of the power controllers 72a to 72e. For example, by calculating the set values of the power controllers 72a to 72e by PID control, the controller 100 controls the output to each of the power controllers 72a to 72e, that is, the amount of heat generated by each of the heaters 70a to 70e.

The heat treatment apparatus 1 includes the controller 100 such as a computer configured to control the entire operation of the heat treatment apparatus 1. The controller 100 is connected to a storage unit 102 that stores control programs for realizing various processings executed by the heat treatment apparatus 1 by the controller 100, or various programs for causing respective components of the heat treatment apparatus 1 to execute processings according to processing conditions. The various programs may be stored in a storage medium and then stored in the storage unit 102. The storage medium may be a hard disk or a semiconductor memory, or may be a portable medium such as a CD-ROM, a DVD, or a flash memory. Further, the storage unit 102 may appropriately communicate with other devices or a host computer by a wired or wireless communication unit.

The controller 100 may be a controller provided separately from the heat treatment apparatus 1. Further, the storage unit 102 may be a storage device provided separately from the heat treatment apparatus 1.

However, when the temperature sensors 80a to 80e are provided at the same position (θ=0 degree) as the opening 22 in the circumferential direction of the inner tube 12, the temperature sensors 80*a* to 80*e* are not positioned at a blind spot with respect to the gas supply pipes 52, 54, and 56. Then, since the gases ejected from the gas supply pipes 52, 54, and 56 have a lower temperature as compared with the temperature in the processing container 10, the detected temperature of the temperature sensors 80*a* to 80*e* is lowered due to the influence of the ejected gases. As a result, since the amount of the heat generated by the heaters 70*a* to 70*e* is controlled so that the decreased detected temperature of the temperature sensors 80*a* to 80*e* may approach the preset target temperature, an overshoot phenomenon is caused by being excessively heated more than the decrease in the detected temperature of the temperature sensors 80*a* to 80*e*. As a result, the time required for stabilizing the temperature in the processing container 10 becomes longer.

Further, the gas supplied to the lower unit region Ze in the vertical direction of the processing container 10 is lower in temperature than the gas supplied to the upper unit region Za. As a result, the temperature sensor 80*e* provided corresponding to the unit region Ze is more affected by the gas than the temperature sensor 80*a* provided corresponding to the unit region Za. In particular, when a large flow rate (e.g., 10 slm or more) of gas is ejected from the gas supply pipes 52, 54, and 56, the decrease in the detected temperature of the temperature sensors 80*a* to 80*e* are greatly affected by the ejected gas. As a result, variation occurs in the temperature controllability in the vertical direction of the processing container 10.

Therefore, in the heat treatment apparatus 1 according to the embodiment, the protection tube 82 accommodating the temperature sensors 80*a* to 80*e* is provided at a position shifted by the predetermined angle θ from the position of the opening 22 in the circumferential direction of the inner tube 12. Therefore, since the temperature sensors 80*a* to 80*e* are positioned at a blind spot from the gas supply pipes 52, 54, and 56, it is possible to suppress the detected temperature of the temperature sensors 80*a* to 80*e* from being lowered by the gases ejected from the gas supply pipes 52, 54, and 56. As described above, in the heat treatment apparatus 1 according to the embodiment, external disturbance may be suppressed, and thus, the temperature controllability may be improved. As a result, the repetition reproducibility of the film forming processing by the same heat treatment apparatus 1 is improved, and further, the difference between a plurality of heat treatment apparatuses 1 may be reduced.

Further, the temperature sensors 80*a* to 80*e* may be provided on a side far from the gas outlet 60 in the circumferential direction of the inner tube 12, in other words, at the position shifted by the predetermined angle θ clockwise from the position of the opening 22 in the circumferential direction of the inner tube 12. After passing through the opening 22, most of the gas ejected from the gas supply pipes 52, 54, and 56 is discharged to the gas outlet 60 through a side close to the gas outlet 60 in the circumferential direction of the inner tube 12 in the space between the inner tube 12 and the outer tube 14. Meanwhile, the amount of the gas discharged to the gas outlet 60 through a side far from the gas outlet 60 in the circumferential direction of the inner tube 12 in the space between the inner tube 12 and the outer tube 14 is smaller than the amount of the gas discharged to the gas outlet 60 through the side close to the gas outlet 60 in the circumferential direction of the inner tube 12. As a result, it is possible to particularly suppress the influence of the gas ejected from the gas supply pipes 52, 54, and 56 by providing the temperature sensors 80*a* to 80*e* on the side far from the gas outlet 60 in the circumferential direction of the inner tube 12.

Further, the predetermined angle θ is greater than 0 degree and equal to or less than 90 degree. When the predetermined angle θ is greater than 90 degree, the position of the protection tube 82 is close to the position at which the gas supply pipes 52, 54, and 56 are provided, and thus, the detected temperature of the temperature sensors 80*a* to 80*e* may be affected by the gas flowing inside the gas supply pipes 52, 54, and 56. With regard to this, when the predetermined angle θ is greater than 0 degree and equal to or less than 90 degree, it is possible to suppress the influence of the gas flowing inside the gas supply pipes 52, 54, and 56 on the temperature sensors 80*a* to 80*e*.

(Film Forming Method)

A film forming method according to an embodiment will be described with reference to an example in which a thin film is formed by an atomic layer deposition (ALD) method using the heat treatment apparatus 1 described above. Examples of the thin film that may be formed by the film forming method according to the embodiment may include an oxide film such as $SiO_2$, $ZrO_2$, $HfO_2$, $TiO_2$, and $Al_2O_3$, a nitride film such as SiN, HfN, TiN, and AlN, or a composite film in which the above compounds are combined such as ZrAlO, HfAlO, and HfSiON.

Figure 3:
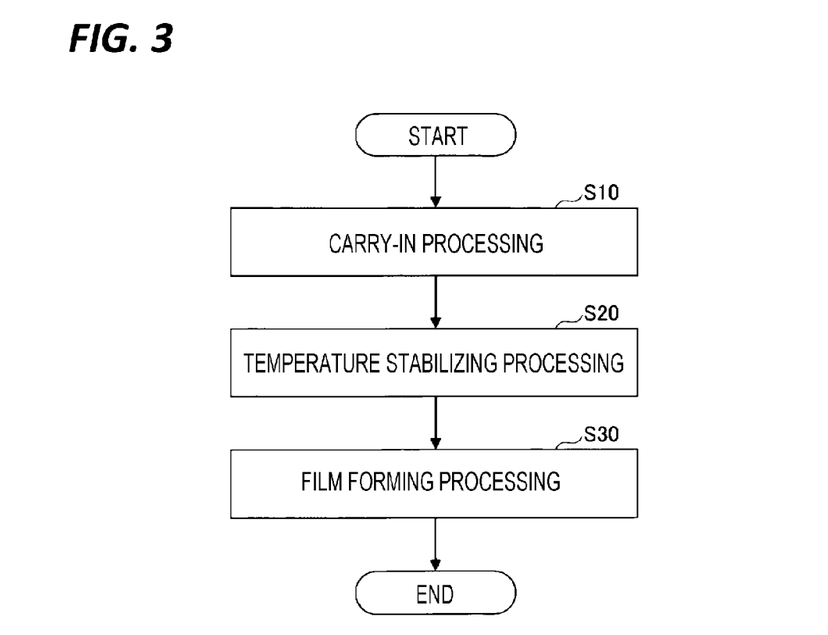
FIG. 3 is a flowchart illustrating an example of a film forming method according to an embodiment.

Hereinafter, descriptions will be made on a case where a silicon nitride (SiN) film is formed on the wafer W using a silicon-containing gas and a nitride gas as raw material gases. FIG. 3 is a flowchart illustrating an example of the film forming method according to an embodiment.

First, the wafer boat 16 holding a plurality of wafers W is carried into the processing container 10 by the lifting unit 38, and the opening at the lower end of the processing container 10 is air-tightly closed to be sealed by the cover 30 (a carry-in processing S10). In the carry-in processing S10, the opening at the lower end of the processing container 10 is opened, so that the temperature in the processing container 10 is lowered. Therefore, the controller 100 controls the outputs of the heaters 70*a* to 70*e* based on the detected temperature of the temperature sensors 80*a* to 80*e* such that the lowered temperature in the processing container 10 is maintained at the set temperature (e.g., 300° C. to 700° C.) determined in advance by, for example, a recipe.

Subsequently, the temperature is stabilized by heating the wafer W in the processing container 10 by the heater 70 (a temperature stabilizing processing S20). In the temperature stabilizing processing S20, for example, the wafer boat 16 may be rotated, or the inside of the processing container 10 may be evacuated by the exhaust unit 62. Further, in the temperature stabilizing processing S20, the controller 100 controls the outputs of the heaters 70*a* to 70*e* based on the detected temperature of the temperature sensors 80*a* to 80*e* such that the temperature in the processing container 10 is maintained at the set temperature (e.g., 300° C. to 700° C.) determined in advance by, for example, a recipe. The set temperature may be the same as the set temperature in the film forming processing S30 from the viewpoint that the temperature fluctuation is reduced at the time of transition from the temperature stabilizing processing S20 to the film forming processing S30 (to be described later).

Subsequently, by the ALD method, a silicon nitride film is formed on the wafers W accommodated in the processing container 10 (the film forming processing S30). In the embodiment, the silicon-containing gas from the gas supply pipe 52, the inert gas from the gas supply pipe 56, the nitride gas from the gas supply pipe 54, and the inert gas from the gas supply pipe 56 are intermittently supplied in this order. Therefore, the silicon-containing gas is adsorbed on the wafers W in the first step of supplying the silicon-containing gas (an adsorption step), and the excess silicon-containing gas is purged in the next step of supplying the inert gas (a first purge step). Then, the nitride gas supplied in the next step of supplying the nitride gas is reacted with the silicon-containing gas (a nitriding step), and the excess nitride gas is purged by the next step of supplying the inert gas (a second purge step), and then, a thin unit film which is almost a mono-molecular layer is formed. A silicon nitride film having a desired film thickness is formed by performing the series of cycles a predetermined number of times. In the film forming processing S30, the controller 100 controls the outputs of the heaters 70a to 70e based on the detected values of the temperature sensors 80a to 80e such that the temperature in the processing container 10 is maintained at the set temperature (e.g., 300° C. to 700° C.) determined in advance by, for example, a recipe.

An example of the processing conditions of the film forming processing S30 is as follows.

Adsorption step: Silicon-containing gas (1 slm to 30 slm), Time (10 to 120 seconds)

First purge step: Inert gas (10 slm to 50 slm), Time (10 to 60 seconds)

Nitriding step: Nitride gas (15 slm to 25 slm), Time (60 to 180 seconds)

Second purge step: Inert gas (10 slm to 50 slm), Time (10 to 60 seconds)

However, the film forming processing S30 may include an evacuation step that evacuates the inside of the processing container 10 to a complete vacuum state of the vacuum pump 68 by the exhaust unit 62, between the adsorption step and the first purge step. Further, the film forming processing S30 may include an evacuation step that evacuates the inside of the processing container 10 to a complete vacuum state of the vacuum pump 68 by the exhaust unit 62, between the nitriding step and the second purge step.

In the forming method according to the embodiment described above, in the carry-in processing S10, the temperature stabilizing processing S20, and the film forming processing S30, the controller 100 controls the output of the heaters 70a to 70e based on the detected temperature of the temperature sensors 80a to 80e.

In the carry-in processing S10, in order to prevent, for example, particles from being entered into the processing container 10, the wafer boat 16 may be carried into the processing container 10 in a state where a purge gas is supplied into the processing container 10 from the gas supply pipe 56 to make the pressure in the processing container 10 positive. At this time, the temperature sensors may be affected by the purge gas ejected from the gas supply pipe 56. Therefore, in the heat treatment apparatus 1 according to the embodiment, the temperature sensors 80a to 80e are provided at a position shifted by the predetermined angle θ from the position of the opening 22 in the circumferential direction of the inner tube 12. Therefore, since the temperature sensors 80a to 80e are positioned at a blind spot from the gas supply pipe 56, it is possible to suppress the detected temperature of the temperature sensors 80a to 80e from being lowered by the purge gas ejected from the gas supply pipe 56. As a result, the controller 100 may control the output of the heaters 70a to 70e based on the detected temperature of the temperature sensors 80a to 80e in which the influence of the purge gas is suppressed. As a result, it is possible to improve the temperature controllability in the carry-in processing S10. In the carry-in processing S10, a purge gas may be supplied into the processing container 10 from the gas supply pipes 52 and 54, other than the gas supply pipe 56.

In the temperature stabilizing processing S20, the temperature of the wafer W may be stabilized while supplying a purge gas into the processing container 10 from the gas supply pipe 56 in order to shorten the time required for the temperature stabilizing by promoting thermal conductivity. At this time, the temperature sensors may be affected by the purge gas ejected from the gas supply pipe 56. Therefore, in the heat treatment apparatus 1 according to the embodiment, the temperature sensors 80a to 80e are provided at a position shifted by the predetermined angle θ from the position of the opening 22 in the circumferential direction of the inner tube 12. Therefore, since the temperature sensors 80a to 80e are positioned at a blind spot from the gas supply pipe 56, it is possible to suppress the detected temperature of the temperature sensors 80a to 80e from being lowered by the purge gas ejected from the gas supply pipe 56. As a result, the controller 100 may control the output of the heaters 70a to 70e based on the detected temperature of the temperature sensors 80a to 80e in which the influence of the purge gas is suppressed. As a result, it is possible to improve the temperature controllability in the temperature stabilizing processing S20.

In the film forming processing S30, a large flow rate of gas is supplied into the processing container 10 in a short time. As a result, the temperature sensors may be affected by the gas supplied at a large flow rate. Therefore, in the heat treatment apparatus 1 according to the embodiment, the temperature sensors 80a to 80e are provided at a position shifted by the predetermined angle θ from the position of the opening 22 in the circumferential direction of the inner tube 12. Therefore, since the temperature sensors 80a to 80e are positioned at a blind spot from the gas supply pipes 52, 54, and 56, it is possible to suppress the detected temperature of the temperature sensors 80a to 80e from being lowered by a silicon-containing gas, a nitride gas, and a purge gas ejected from the gas supply pipes 52, 54, and 56, respectively. As a result, the controller 100 may control the output of the heaters 70a to 70e based on the detected temperature of the temperature sensors 80a to 80e in which the influence of the gases is suppressed. As a result, it is possible to improve the temperature controllability in the film forming processing S30.

Example

Descriptions will be made on an example in which the film forming method according to the embodiment is implemented to evaluate the stability of the detected temperature of the temperature sensors.

In Example 1, the carry-in processing S10, the temperature stabilizing processing S20, and the film forming processing S30 described above are performed using the heat treatment apparatus 1 in which the temperature sensors 80a to 80e are provided at a position shifted by 30 degrees from the position of the opening 22 in the circumferential direction of the inner tube 12. Then, in each of the processings, a temporal change in detected temperature of the temperature sensors 80a, 80c, and 80e is evaluated. In Example 1, $N_2$ gas is used instead of the silicon-containing gas used in the adsorption step and the nitride gas used in the nitriding step. The processing conditions in the film forming processing S30 in Example 1 are as follows.

Adsorption step: $N_2$ gas (1 slm to 30 slm)

First purge step: $N_2$ gas (10 slm to 50 slm)

Nitriding step: $N_2$ gas (15 slm to 25 slm)

Second purge step: $N_2$ gas (10 slm to 50 slm)

Further, following Comparative Example 1 is implemented for comparison with Example 1. In Comparative Example 1, the carry-in processing S10, the temperature stabilizing processing S20, and the film forming processing S30 are performed under the same conditions as the Example 1 using a heat treatment apparatus in which the temperature sensors 80a to 80e are provided at the position of the opening 22 in the circumferential direction of the inner tube 12. Then, in each of the processings, a temporal change in detected temperature of the temperature sensors 80a, 80c, and 80e is evaluated.

Figure 4A:
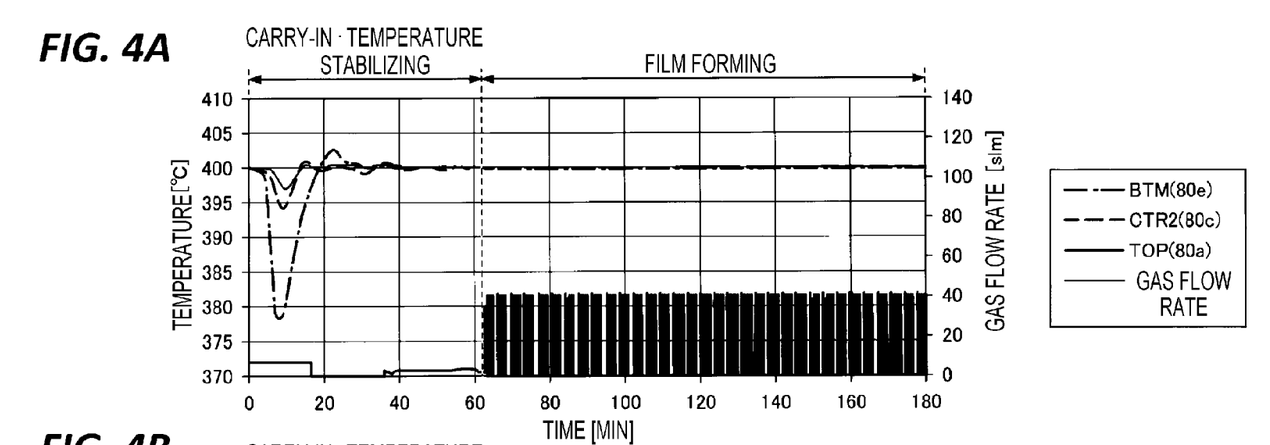
FIGS. 4A and 4B are views illustrating a temporal change in detected temperatures of temperature sensors in Example 1.
Figure 4B:
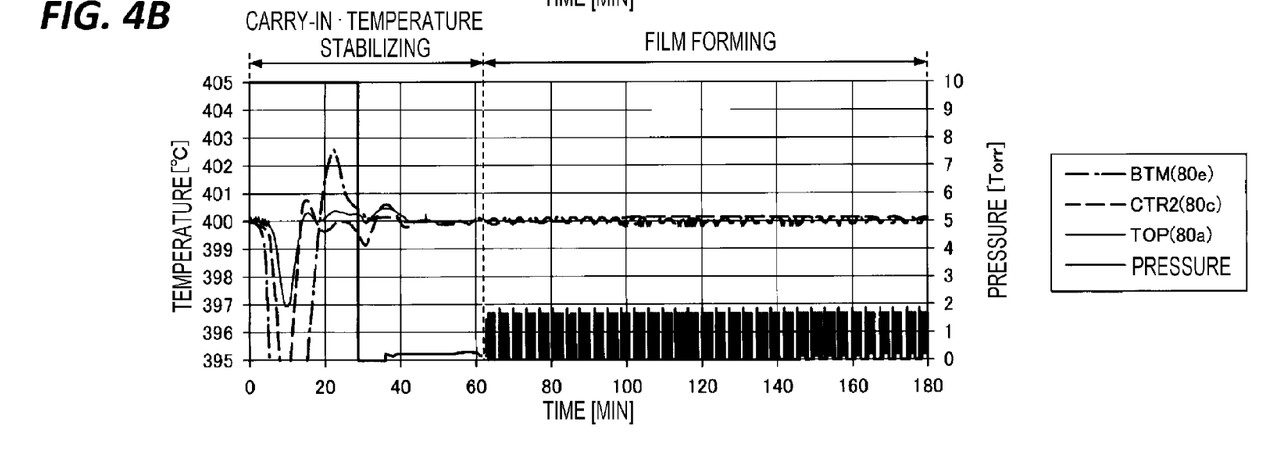

FIGS. 4A and 4B are views illustrating a temporal change in a detected temperature of the temperature sensors in Example 1. FIG. 4A illustrates a temporal change in the flow rate of the gas supplied into the processing container 10 (a bold solid line), and temporal changes in the detected temperatures of the temperature sensors 80a, 80c, and 80e (a thin solid line, a broken line, and a dashed line, respectively). FIG. 4B illustrates an enlarged view of a temporal change in the pressure in the processing container 10 (bold solid line) and a temporal change in the detected temperatures of the temperature sensors 80a, 80c, and 80e in FIG. 4A (thin solid line, broken line, and dashed line, respectively). In FIG. 4A, the horizontal axis represents time [min], the first vertical axis represents sensor temperature [° C.], and the second vertical axis represents gas flow rate [slm]. In FIG. 4B, the horizontal axis represents time [min], the first vertical axis represents sensor temperature [° C.], and the second vertical axis represents pressure [Torr].

Figure 5A:
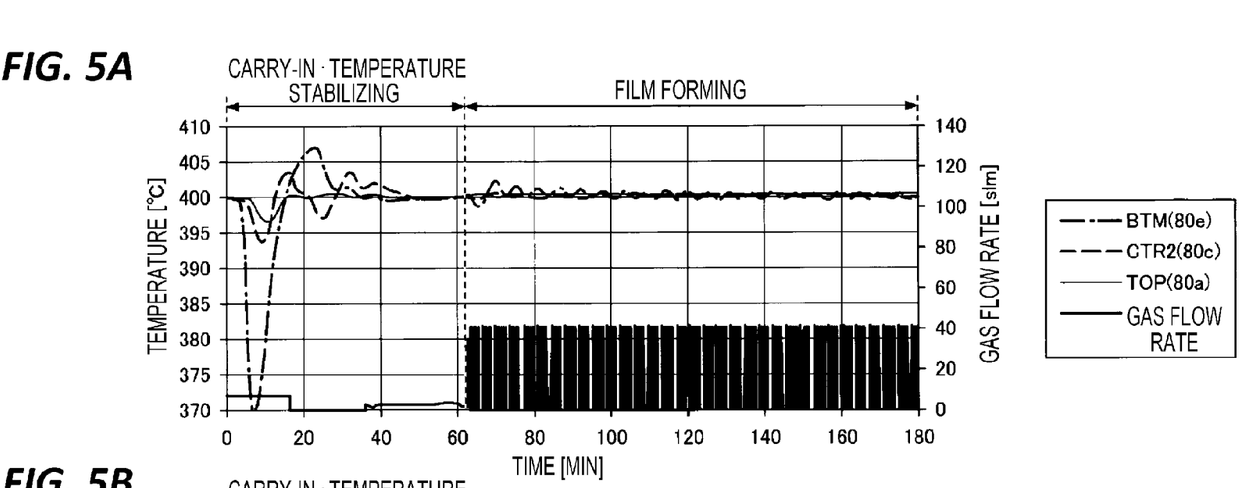
FIGS. 5A and 5B are views illustrating a temporal change in detected temperatures of temperature sensors in Comparative Example 1.
Figure 5B:
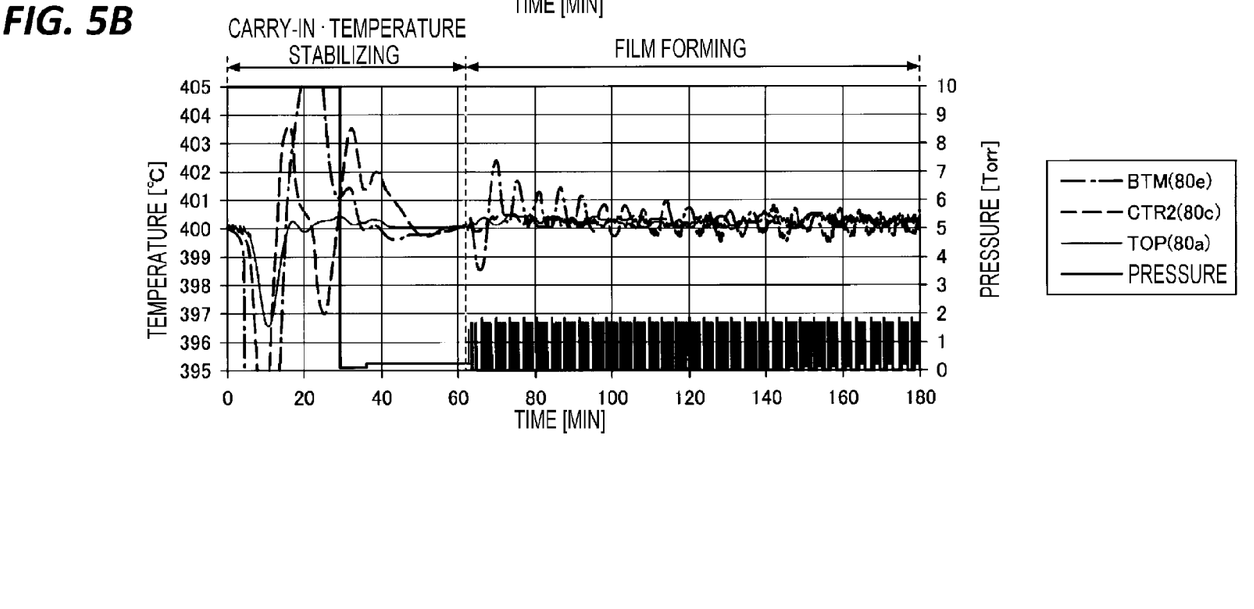

FIGS. 5A and 5B are views illustrating a temporal change in a detected temperature of temperature sensors in Comparative Example 1. FIG. 5A illustrates a temporal change in the flow rate of the gas supplied into the processing container 10 (bold solid line), and temporal changes in the detected temperatures of the temperature sensors 80a, 80c, and 80e (thin solid line, broken line, and dashed line, respectively). FIG. 5B illustrates an enlarged view of a temporal change in the pressure in the processing container 10 (bold solid line) and temporal changes in the detected temperatures of the temperature sensors 80a, 80c, and 80e in FIG. 5A (thin solid line, broken line, and dashed line, respectively). In FIG. 5A, the horizontal axis represents time [min], the first vertical axis represents sensor temperature [° C.], and the second vertical axis represents gas flow rate [slm]. In FIG. 5B, the horizontal axis represents time [min], the first vertical axis represents sensor temperature [° C.], and the second vertical axis represents pressure [Torr].

When comparing the results illustrated in FIGS. 4A and 4B, and 5A and 5B, in the carry-in processing S10 and the temperature stabilizing processing S20, the disturbance in the detected temperature of the temperature sensors 80a, 80c, and 80e is smaller in Example 1 than in Comparative Example 1. That is, it is considered that, in Comparative Example 1, the detected temperature of the temperature sensors 80a, 80c, and 80e is greatly lowered due to the influence of the $N_2$ gas supplied into the processing container 10 from the gas supply pipe 56 in the carry-in processing S10 and the temperature stabilizing processing S20. With regard to this, it is considered that, in Example 1, the influence on the detected temperature of the temperature sensors 80a, 80c, and 80e due to the $N_2$ gas supplied into the processing container 10 from the gas supply pipe 56 is small in the carry-in processing S10 and the temperature stabilizing processing S20. Further, it may be seen that, in Example 1, the disturbance in the detected temperature of the temperature sensor 80e is particularly small as compared with Comparative Example 1.

Further, as illustrated in FIGS. 4A and 4B, and 5A and 5B, it may be seen that, in the film forming processing S30, disturbance in the detected temperature of the temperature sensor 80e occurs in Comparative Example 1, but disturbance in the detected temperature of any of the temperature sensors 80a, 80c, and 80e hardly occurs in Example 1. That is, it is considered that, in Comparative Example 1, the detected temperature of the temperature sensor 80e is lowered due to the influence of the $N_2$ gas supplied into the processing container 10 from the gas supply pipes 52, 54, and 56 in the film forming processing S30. With regard to this, it is considered that, in Example 1, the influence on the detected temperature of the temperature sensors 80a, 80c, and 80e due to the $N_2$ gas supplied into the processing container 10 from the gas supply pipes 52, 54, and 56 is small in the film forming processing S30.

According to the embodiment described above, it is found that the influence of the gases ejected from the gas supply pipes 52, 54, and 56 may be suppressed by providing the temperature sensors 80a, 80c, and 80e at the position shifted by the predetermined angle θ from the opening 22 in the circumferential direction of the inner tube 12.

According to the present disclosure, it is possible to improve the temperature controllability.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus comprising:
an inner tube having a cylindrical shape and configured to accommodate a substrate;
an outer tube configured to cover an outside of the inner tube;
a heater provided around the outer tube;
a gas supply pipe extending along a longitudinal direction in the inner tube;
an opening formed in a side wall of the inner tube that faces the gas supply pipe;
a gas outlet connected to a position of the outer tube different from a position of the opening of the inner tube in a circumferential direction;
a first space continuously extending in an anticlockwise direction between the inner tube and the outer tube from the opening to the gas outlet when viewed in a horizontal cross section;
a second space continuously extending in a clockwise direction between the inner tube and the outer tube from the opening to the gas outlet, and having a length longer than that of the first space when viewed in the horizontal cross section;
a temperature sensor provided at a position shifted by a predetermined angle from the opening in the circumferential direction of the inner tube such that the temperature sensor is provided in the second space between a semi-circle of the inner tube positioned at an opposite side to the gas outlet and the outer tube, thereby discharging a smaller amount of gas through the second space in which the temperature sensor is provided than the first space, the semi-circle of the inner tube being one of two semi-circles defined by a line connected between the opening and the gas supply pipe when viewed in a horizontal cross section; and a controller configured to control the heater based on a detected value of the temperature sensor.

2. The heat treatment apparatus according to claim 1, wherein the gas outlet is connected to a position of the outer tube corresponding to the position between the opening and the gas supply pipe in the circumferential direction of the inner tube.

3. The heat treatment apparatus according to claim 2, wherein the predetermined angle is greater than 0 degree and equal to or less than 90 degrees.

4. The heat treatment apparatus according to claim 3, wherein a plurality of gas holes is formed in the gas supply pipe along the longitudinal direction.

5. The heat treatment apparatus according to claim 4, wherein a plurality of substrates is substantially horizontally accommodated in the inner tube at predetermined intervals along a vertical direction.

6. The heat treatment apparatus according to claim 5, wherein the temperature sensor includes a plurality of temperature detectors arranged along the longitudinal direction of the inner tube.

7. The heat treatment apparatus according to claim 6, wherein the temperature sensor is a thermocouple or a thermoresistor.

8. The heat treatment apparatus according to claim 1, wherein the predetermined angle is greater than 0 degree and equal to or less than 90 degrees.

9. The heat treatment apparatus according to claim 1, wherein a plurality of gas holes is formed in the gas supply pipe along the longitudinal direction.

10. The heat treatment apparatus according to claim 1, wherein a plurality of substrates is substantially horizontally accommodated in the inner tube at predetermined intervals along a vertical direction.

11. The heat treatment apparatus according to claim 1, wherein the temperature sensor includes a plurality of temperature detectors arranged along the longitudinal direction of the inner tube.

12. The heat treatment apparatus according to claim 1, wherein the temperature sensor is a thermocouple, or a thermoresistor.

13. The heat treatment apparatus according to claim 1, wherein the gas outlet is connected to the outer tube at a side where the other of the two semi-circles of the inner tube is positioned, and the temperature sensor is provided at a directly opposite position to the gas outlet in the second space.

14. A heat treatment method for a substrate by a heat treatment apparatus including:
   an inner tube having a cylindrical shape and configured to accommodate a substrate;
   an outer tube configured to cover an outside of the inner tube;
   a heater provided around the outer tube;
   a gas supply pipe extending along a longitudinal direction in the inner tube;
   an opening formed on a side wall of the inner tube that faces the gas supply pipe; and
   a gas outlet connected to a position of the outer tube different from a position of the opening of the inner tube in a circumferential direction;
   a first space continuously extending in an anticlockwise direction between the inner tube and the outer tube from the opening to the gas outlet when viewed in a horizontal cross section;
   a second space continuously extending in a clockwise direction between the inner tube and the outer tube from the opening to the gas outlet, and having a length longer than that of the first space when viewed in the horizontal cross section,
the heat treatment method comprising:
providing a temperature sensor at a position shifted by a predetermined angle from the opening in the circumferential direction of the inner tube such that the temperature sensor is provided in the second space between a semi-circle of the inner tube positioned at an opposite side to the gas outlet and the outer tube, thereby discharging a smaller amount of gas through the second space in which the temperature sensor is provided than the first space, the semi-circle of the inner tube being one of two semi-circles defined by a line connected between the opening and the gas supply pipe when viewed in a horizontal cross section; and
conducting a heat treatment for the substrate by controlling the heater based on a detected value of the temperature sensor.

15. A film forming method comprising:
providing a heat treatment apparatus including:
an inner tube having a cylindrical shape and configured to accommodate a substrate;
an outer tube configured to cover an outside of the inner tube;
a heater provided around the outer tube;
a plurality of gas supply pipes extending along a longitudinal direction on an inner wall of the inner tube; and
an opening formed on a side wall of the inner tube that faces the plurality of gas supply pipes;
a gas outlet connected to a position of the outer tube different from a position of the opening of the inner tube in a circumferential direction;
a first space continuously extending in an anticlockwise direction between the inner tube and the outer tube from the opening to the gas outlet when viewed in a horizontal cross section;
a second space continuously extending in a clockwise direction between the inner tube and the outer tube from the opening to the gas outlet, and having a length longer than that of the first space when viewed in the horizontal cross section;
providing a temperature sensor at a position shifted by a predetermined angle from the opening in the circumferential direction of the inner tube such that the temperature sensor is provided in the second space between a semi-circle of the inner tube positioned at an opposite side to the gas outlet and the outer tube, thereby discharging a smaller amount of gas through the second space in which the temperature sensor is provided than the first space, the semi-circle of the inner tube being one of two semi-circles defined by a line connected between the opening and the gas supply pipe when viewed in a horizontal cross section; and
depositing a film on the substrate accommodated in the inner tube by alternately supplying a plurality of raw gases from the plurality of gas supply pipes to the substrate while controlling the heater based on a detected value of the temperature sensor.

* * * * *